United States Patent [19]

Ishii et al.

[11] Patent Number: 5,261,935
[45] Date of Patent: Nov. 16, 1993

[54] CLEAN AIR APPARATUS

[75] Inventors: Katsumi Ishii, Fujino; Takanobu Asano, Yokohama; Masaharu Abe, Sagamihara; Kenichi Yamaga, Sagamihara; Kazunari Sakata, Sagamihara; Takashi Tanahashi, Machida; Syuji Moriya, Yamanashi, all of Japan

[73] Assignee: Tokyo Electron Sagami Limited, Kanagawa, Japan

[21] Appl. No.: 23,394

[22] Filed: Feb. 26, 1993

Related U.S. Application Data

[63] Continuation-in-part of Ser. No. 911,479, Jul. 10, 1992, Pat. No. 5,219,464, which is a continuation-in-part of Ser. No. 772,836, Oct. 8, 1991, Pat. No. 5,181,819, and Ser. No. 765,890, Sep. 26, 1991, Pat. No. 5,256,181.

[30] Foreign Application Priority Data

| | | |
|---|---|---|
| Sep. 26, 1990 [JP] | Japan | 2-256160 |
| Oct. 9, 1990 [JP] | Japan | 2-273027 |
| Oct. 17, 1990 [JP] | Japan | 2-278576 |
| Oct. 17, 1990 [JP] | Japan | 2-278577 |
| Nov. 30, 1990 [JP] | Japan | 2-335661 |
| Jul. 11, 1991 [JP] | Japan | 3-196076 |

[51] Int. Cl.⁵ ............................................. B01D 46/04
[52] U.S. Cl. .................................. 55/213; 55/271; 55/385; 55/472; 414/187; 414/217
[58] Field of Search ................. 55/96, 97, 2 B, 270, 55/271, 385.2, 467, 472, 500; 414/187, 217

[56] References Cited

U.S. PATENT DOCUMENTS

| | | | |
|---|---|---|---|
| 3,944,405 | 3/1976 | van Calsteren et al. | 98/115.3 X |
| 4,693,173 | 9/1987 | Saiki et al. | 55/385.2 X |
| 4,832,717 | 5/1989 | Peters | 98/115.3 X |
| 4,923,352 | 5/1990 | Tamuya et al. | 98/115.3 X |
| 5,059,079 | 10/1991 | Foulke et al. | 98/115.3 X |
| 5,064,337 | 11/1991 | Asakawa et al. | 98/115.3 X |

*Primary Examiner*—Charles Hart
*Attorney, Agent, or Firm*—Oblon, Spivak, McClelland, Maier & Neustadt

[57] ABSTRACT

A clean air apparatus includes a housing having an opening through which a carrier housing semiconductor wafers is supplied into the housing and an I/O port for supporting the carrier and a furnace for treating the wafer, provided in the upper portion of the housing. The carriers are at the same time supported by a first carrier stage provided in the upper portion of the housing and supported by a second carrier stage provided in the lower portion of the housing. The carrier or carriers are selectively moved between the I/O port and the first stage, between the I/O port and the second stage, and between the first stage and the second stage. A clean air is applied to the wafers in the carriers supported by the I/O port, the first stage and the second stage.

11 Claims, 9 Drawing Sheets

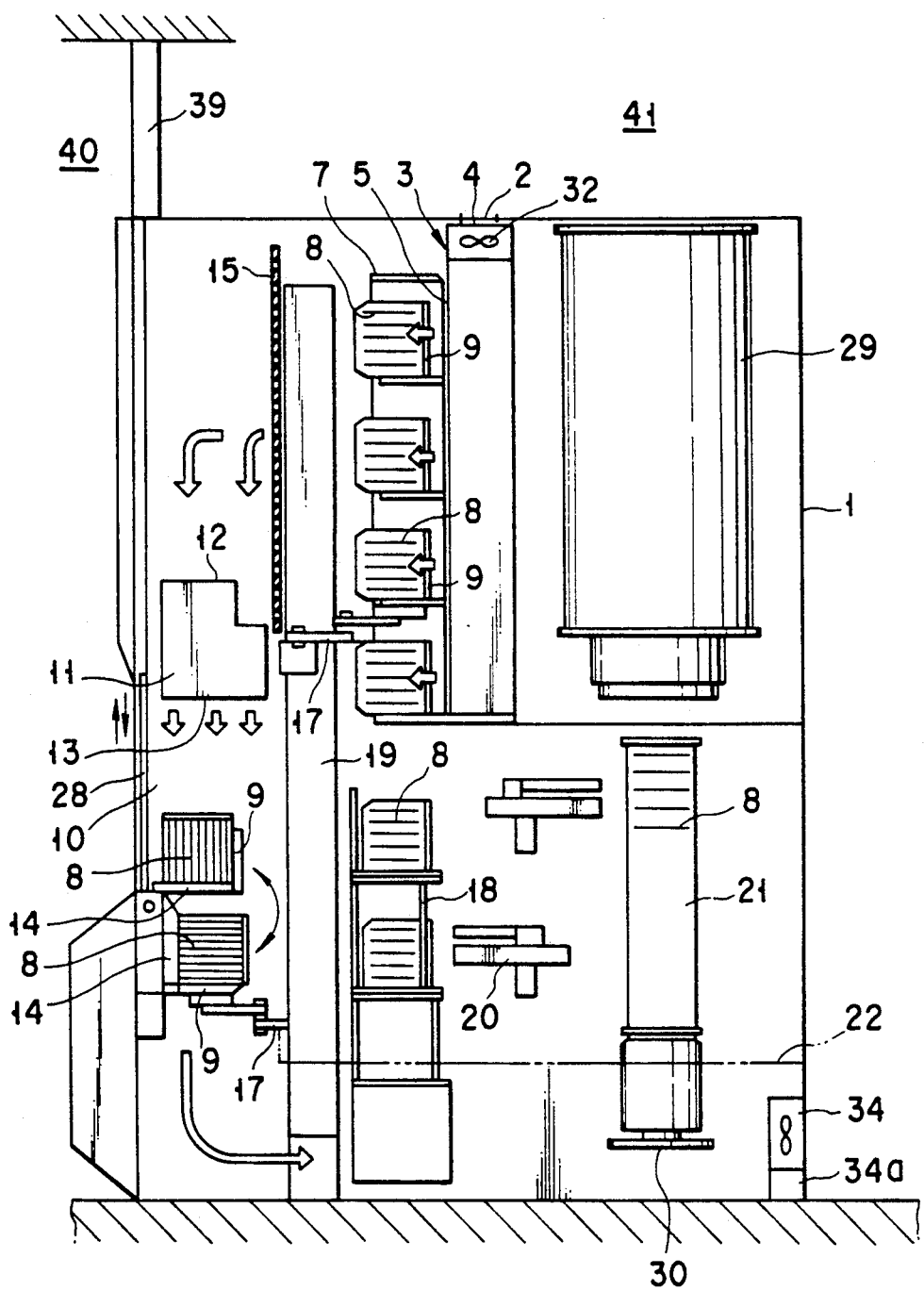
F I G. 1

CLEAN AIR APPARATUS

CROSS-REFERENCE TO THE RELATED APPLICATIONS

This invention is a continuation-in-part of U.S. patent application Ser. No. 911,479 filed on Jul. 10, 1992, now U.S. Pat. No. 5,219,464, which is a continuation-in-part of U.S. patent application Ser. No. 722,836 filed on Oct. 8, 1991, now U.S. Pat. No. 5,181,819, and of U.S. patent application Ser. No. 765,890 filed on Sep. 26, 1991 now U.S. Pat. No. 5,236,181..

BACKGROUND OF THE INVENTION

1. Field of the Invention

The present invention relates to a clean air apparatus used in a manufacturing process of semiconductor elements, and an apparatus for processing semiconductors using the clean air apparatus. 2. Description of the Related Art Regarding an apparatus for manufacturing semiconductors, the density of semiconductor elements has recently been increased and fine dusts attached to the semiconductor elements in the manufacturing process make the semiconductor elements defective. As a result, the yield is reduced. Therefore, it is important to prevent such dusts. In particular, as the integration density increases, smaller dusts must be taken into consideration. In order to solve this problem, the semiconductor manufacturing apparatus, such as a heat treating apparatus, etching apparatus, spatter apparatus, etc. is installed in a clean room. In this room, the vertical flow of clean air is formed as follows: after passing air sent from an air blowing apparatus to a ceiling, the air is blown toward the floor through a filter installed in the ceiling, and the air is exhausted from the floor.

However, since the content volume of the clean room is limited and more production lines are required to be provided, semiconductor wafers are processed in the clean room, and the most of semiconductor processing apparatuses are arranged in a maintenance room which has comparatively low cleanliness and is separated from the clean room by means of a partition wall.

This type of the apparatus, i.e. through-the-wall type semiconductor processing apparatus comprises an opening/closing door for carrying wafers to be treated in/out of the main body or housing of the apparatus, in front of an apparatus positioned in the clean room. The door is opened from the clean room side, and a carrier housing wears is carried in and out of the mounting portion provided in the apparatus.

The pressure in the clean room is generally higher than the pressure in the maintenance room. The flow of air from the clean room side to the maintenance room side through the body of the apparatus is formed by the differential pressure, when the door is opened in the case of carrying the wafer carrier in the apparatus.

Although the inside of the clean room is always clean, a workman in the clean room is the source of generating dusts. Therefore, when this workman carries the carrier housing wafers in the semiconductor processing apparatus, the dusts are dispersed and carried by means of the flow of air blown into the apparatus from the clean room side, so that the yield of the semiconductor elements is reduced.

In order to settle this problem, Published Unexamined Japanese Patent Application (PUJPA) No. 61-2602 discloses technique wherein clean air circulates in the semiconductor processing apparatus. Moreover, PUJPA No. 59-100517 discloses technique wherein an opening portion of the apparatus is covered with the flow of the carrier gas so as to control the entering of the outer air.

In the case that clean air is circulated in the former processing apparatus, the inside of the apparatus can be kept clean when the apparatus is closed and the clean air is normally circulated in the apparatus. However, when a part of the apparatus is opened, e.g. when an opening/closing door is opened in the case of carrying the wafers in/out of the apparatus and the carrier housing the wafers is carried in the apparatus, the dusts dispersed from the workman of the clean room side are entered in the apparatus, and the yield of the semiconductor elements is reduced.

In the case of providing air shower at the opening/closing door for carrying the carrier in the latter technique disclosed in PUJPA No. 59-100517, it is difficult to form a laminar flow air curtain between the clean room and the inside of the apparatus, and moreover, the dusts, etc. enter into the apparatus from the clean room side, so that the yield of the semiconductor elements is reduced.

SUMMARY OF THE INVENTION

The object of the present invention is to provide a clean air apparatus in which objects to be treated may be prevented from attaching of dusts or the like, and/or dusts attached to the objects may be removed, in a housing.

BRIEF DESCRIPTION OF THE DRAWINGS

The accompanying drawings, which are incorporated in and constitute a part of the specification, illustrate presently preferred embodiments of the invention, and together with the general description given above and the detailed description given above and the detailed description of the preferred embodiments given below, serve to explain the principles of the invention.

FIG. 1 is a schematic view of the internal structure of a vertical heat treating apparatus which is an embodiment of a semiconductor treating apparatus according to this invention;

DETAILED DESCRIPTION OF THE PREFERRED EMBODIMENTS

Figure 2:
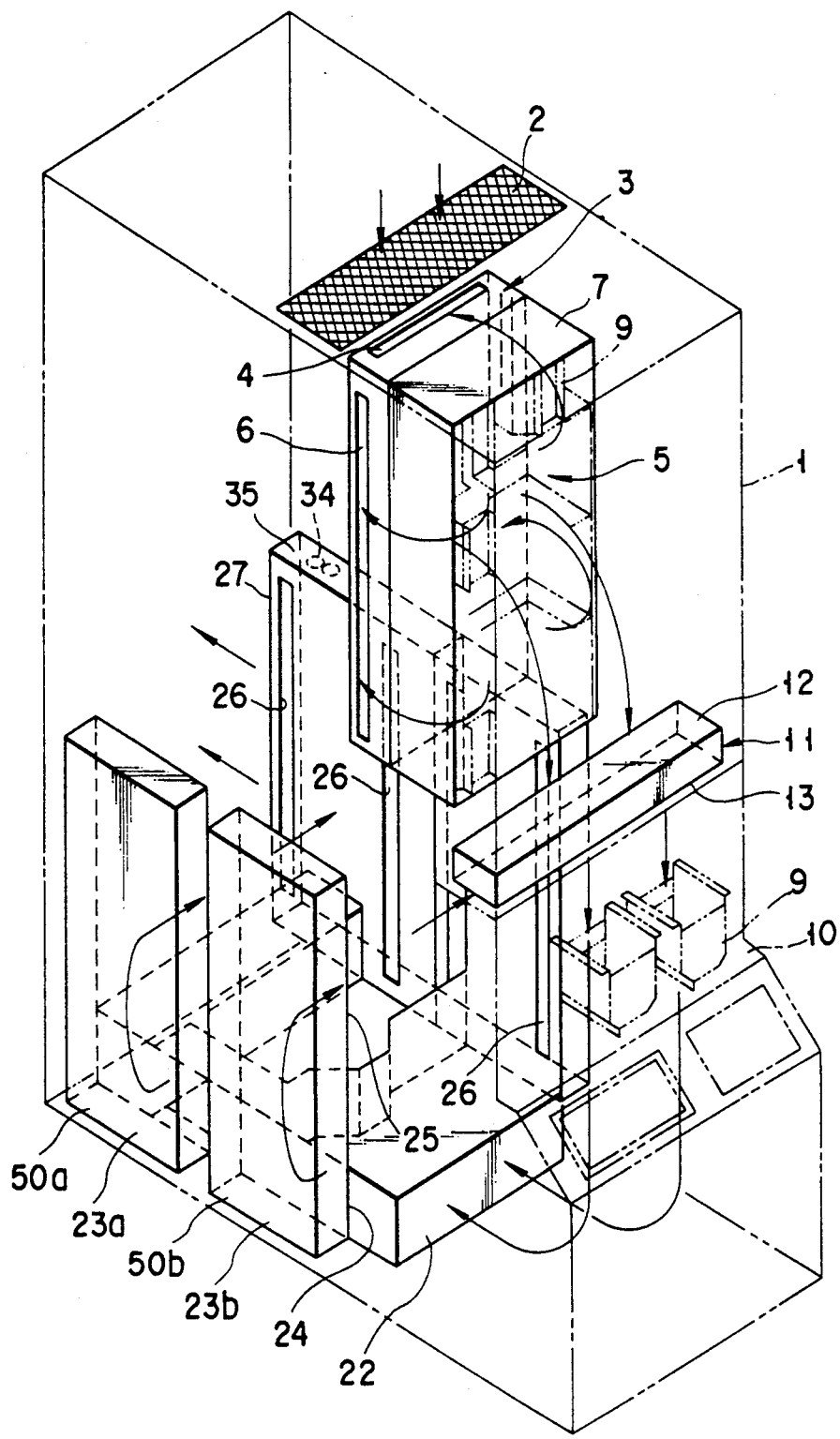
FIG. 2 is a perspective view of a filter unit of this embodiment.

This invention will now be explained by way of an embodiment in a form of a vertical heat treating apparatus as a semiconductor processing apparatus or a clean air apparatus which reference to the accompanying drawings.

As shown in FIG. 1, a vertical heat treating apparatus according to an embodiment of this invention has a main body 1 of the apparatus, the front face portion of which is housed in a clean room 40. The rear portion of the main body 1 is inserted in a maintenance room 41 separated from the clean room 40 by means of a partition wall 39.

In the front face of the main body 1 is provided auto doors 28 though which carriers 9 each supporting a plurality of (25, for example) disc-shaped semiconductor wafers 8 are carried in the main body 1 and out therefrom. When carried in the main body 1 and out therefrom, the wafers 8 are inserted in wafer receiving grooves (not shown) formed in the carrier 9 so as to take a vertical position. The carrier 9 is opened at the front and rear walls for passing air.

Figure 3:
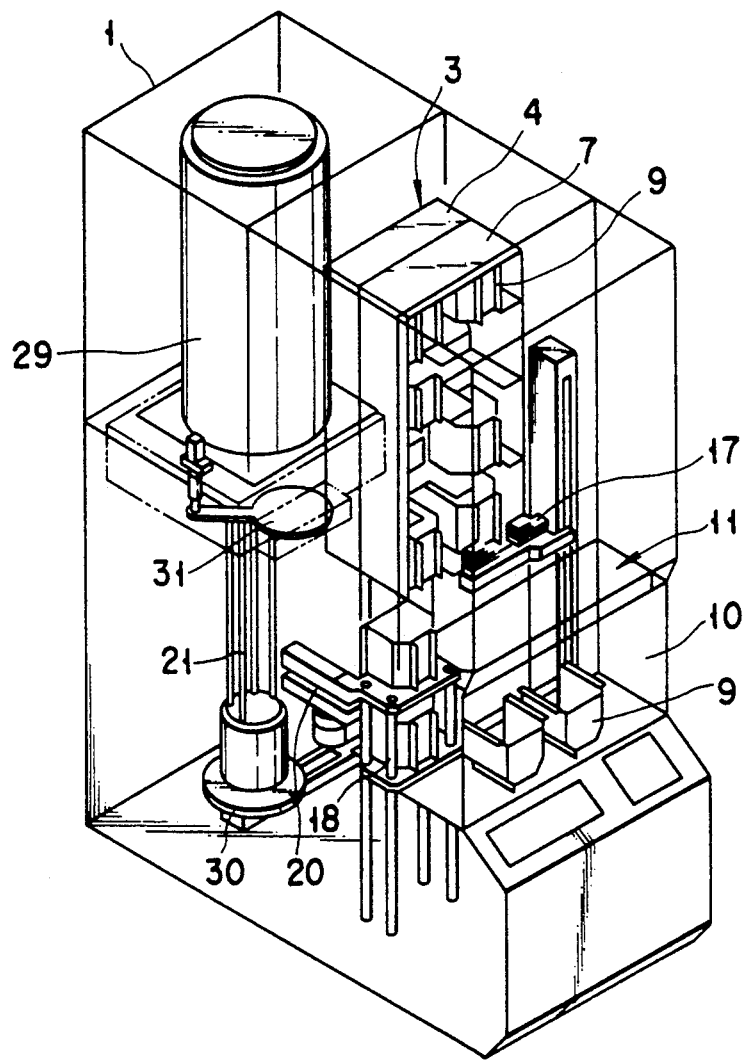
FIG. 3 is a perspective view of the internal structure of the vertical heat treating apparatus.
Figure 4:
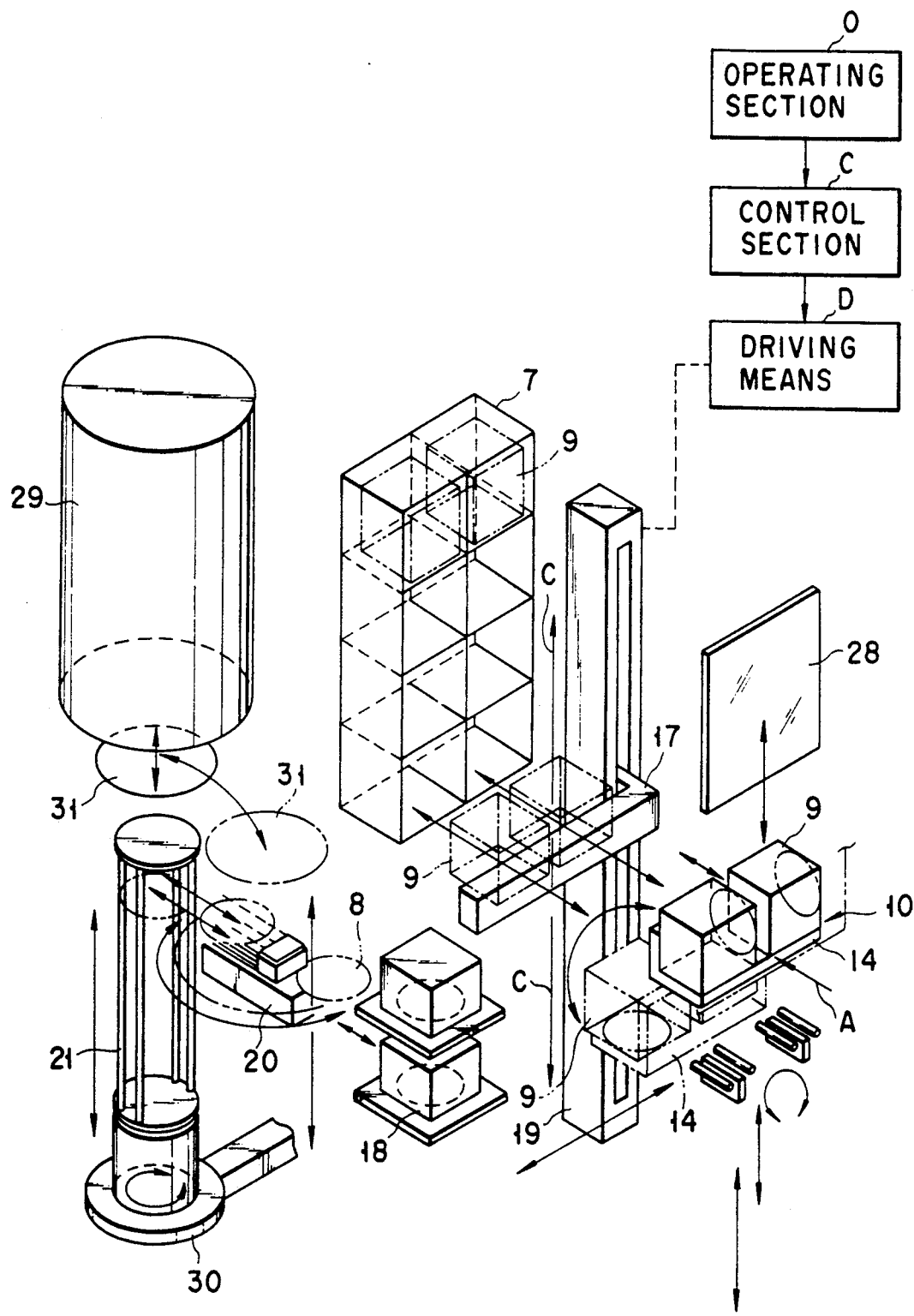
FIG. 4 is a perspective view showing the operation of the movable portions of the vertical treating apparatus of FIG. 3.

Referring to FIGS. 3 and 4, the carriers 9 which have been carried in the main body 1 as shown by an arrow A in FIG. 4 are loaded on an I/0 port 10 (which can load two carriers 9, for example, at a time). Above the I/0 port 10 is provided a carrier stage 7 which can hold a plurality of carries 9 (in this embodiment, 8 carriers arranged in two rows and in four steps) such that the carries 9 are moved by an elevator 19 in directions C so as to be carried in the main body 1 and out therefrom.

A heat treating furnace 29 which heat-treats wafers 8 is provided in the rear upper portion of the main body 1. A wafer boat 21 made of heat-resistive material such as quartz is loaded in and out from the heat treating furnace 29 by means of a boat elevator 30. An openable shutter 31 for insulating heat in the heat treating furnace 29 is provided in the lower portion of the heat treating furnace 29.

The I/0 port 10 contains a position changing mechanism 14 on which the carrier 9 is moved with the opened rear-face positioned upwardly and which turns through substantially 90° the carriers 9 holding semiconductor wafers 8 arranged in the vertical length-wise direction. The carriers 9 horizontally holding the wafers are selectively transported by a carrier transfer 17 vertically moved by the elevator 19 to the carriage stage 7 and a transfer stage 18. The carrier transfer 17 may be vertically moved along the elevator 19 by driving means D. The driving means D selectively allows the carrier transfer 17 among the movements between the position changing mechanism 14 and the carrier stage 7, between the position changing mechanism 14 and the transfer stage 18, and between the carrier stage 7 and the stage 18, according to command signals from a control section C. Such a selecting control of the movements of the transfer 17 may be performed according to programs previously set in an operating section O or manually one by one. The wafers 8 in the carriers 9 transported to the transfer stage 18 are moved to the wear boat 21 by means of a wafer transfer 20. The carriers 9 moved in the carrier stage 7 hold the wafers 8 horizontally, and the wafers 8 are transferred between the wafer boat 21 and the carriers 9 also in a horizontal manner.

As shown in FIG. 2, a meshed air inlet port 2 is formed in the central top portion of the main body 1 and an elongated first filter unit 3 having suction fan 32 is provided close to the air inlet port 2. The unit 3 is formed in its upper surface with an air intake port 4 and in its front face with an air outlet port 5. The air outlet port 5 has an air blowing-out area of S1 such that clean air forms a side flow on all the wafers 8 horizontally held in the carriers 9.

The second filter unit 11 has such an air blowing-out area S2 that clean air forms a down flow on all the wafers 8 held vertically in two carriers 9 on the I/O port 10. The areas are set such that $S1:S2=4:1$.

Figure 5:
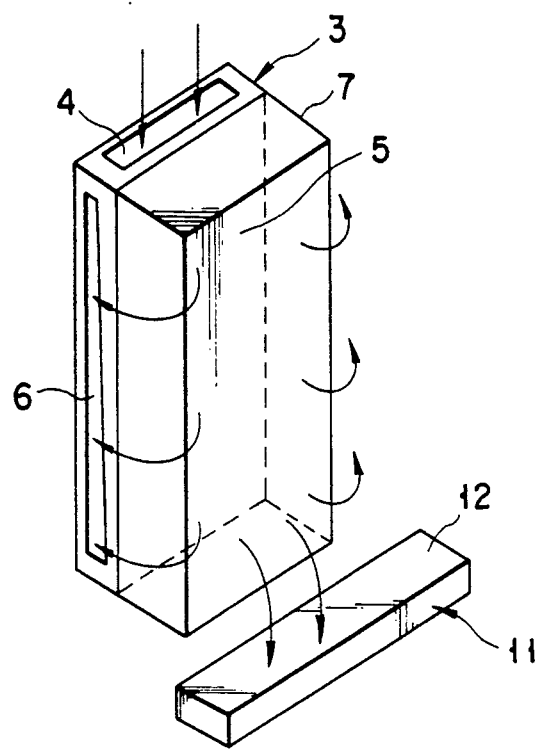
FIG. 5 is a perspective view illustrating air flows at a first filter unit and a second filter unit.
Figure 6:
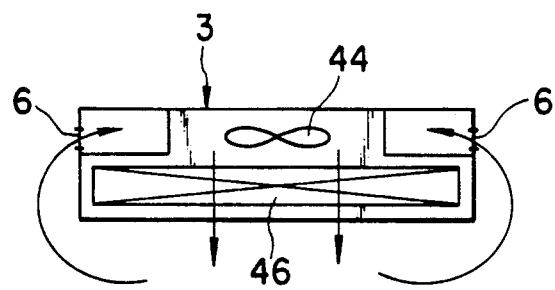
FIG. 6 is a view depicting the internal structure of the first filter unit of FIG. 5.

The first filter unit 3 is provided at one side thereof with an air return port 6 whose width is widened more and more as the position is lowered, as shown in FIG. 5 and houses a filter 46 and an air fan 44, as shown in FIG. 6.

When the taken-in amount of air by the air intake port 4 provided in the first filter unit 3 is larger than the discharged amount of air from the air outlet port 5 provided in the first filter unit 3, part of the discharged clean air returns to the air return port 6 of the filter unit 3 and is discharged from the air outlet port 5 again. It follows, therefore, that the total taken-in amount of air from the air ports 4, 6 and the discharged amount of air from the air outlet port 5 are substantially equal to each other, and blown out air flows in a stable, laminated manner.

The air intake port 4 and the air return port 6 are provided with dampers for adjusting air flows such that each damper is designed to suitably adjust the flow ratio between the air intake port 4 and the air return port 6.

On the front face of the first filter unit 3 as shown in FIG. 1 is provided the carrier stage 7 which contains the carriers 9 in which a plurality of semiconductor wafers 8 are arranged in parallel with the direction of the air discharge. The carrier stage 7 has a housing 7a which is integrally formed with a housing 3a of the filter unit 3 and of which front face is open and rear closed wall having a plurality of small through holes formed therein. The through holes are communicated with a filter body 3b of the filter unit 3. The upper wall of the housing 3a is provided with said air intake port 4 and in the upper portion of the housing 3a is mounted said suction fun 32. Thus, by driving of the fun 32, an air flow introduced into the main body 1 through the inlet port 2 flows into the housing through the port 4 and enters into the filter body 3b. The filtered or cleaned air flow is introduced into the housing 7 through the small through holes in the rear wall, then passes on the surfaces of the wafers and finally discharged from the front opening of the housing 7a. In the housing 7a three shelves 7b are provided, which are apart from each other in the vertical direction. Each shelf and the bottom wall of the housing 7a respectively support tow carriers 9 thereon and thus eight carriers may be totally supported by the carrier stage 7 at the same time, as described above. In front of the carrier stage 7 is disposed an air blowing control plate 15 formed with a great number of small holes defining an opening ratio of substantially 20%. Pressure is lowered at the front side of the air blowing control plate 15 and air which has passed through the holes is reduced in its speed to be sent forward, whereby air is prevented by the air control plate 15 from staying between the carrier stage 7 and the main body 1 and being blown unevenly as shown by arrows in FIG. 1.

The air which has passed the carriers 9 and the air blowing control plate 15 is taken in from the air intake port 12 of the second filter unit 11 provided close to the I/O port 10 of the main body 1, and clean air is blown out from the air outlet port 13 of the second filter unit 11.

As shown in FIG. 1, the air outlet port 13 of the second filter unit 11 is opened wide such that clean air discharged from the air outlet port 13 forms an air curtain. External air is hindered from flowing from the I/O port 10 into the main body 1.

In the lower portion of the main body 1 is provided a lower duct 22 into which flows air passing the region on the wafers 8 in the carriers 9 supported by the I/O port. As shown in FIG. 2, on one side wall of the lower portion of the main body 1 are provided third filter units 23a and 23b each having an air intake port 24 at the lower part and an air outlet port 25 at the upper part. Clean air taken in from the lower duct 22 is sent out laterally of the main body 1 from the air outlet port 25 through the air intake port 24 and is supplied laterally in a laminated state to the wafer boat 2 disposed close to the air outlet ports 25 of the third air filter units 23a and 23b.

As shown in FIG. 2 in the opposite side wall of the lower portion of the main body 1 are formed side ducts 35 having air intake ports 26 disclosed opposite to the air outlet ports 25 of the third filter units 23a and 23b. The side duct 35 is formed with an air discharging port 27 opened to the maintenance room 41. The side duct 35 is provided with exhaust fan 34. Air which has passed the region on the wafer boat 21 flows in from the air intake ports 26 of the side duct 35 and is discharged from the air discharging port 27 by means of exhaust fan 34.

The operation of the embodiment of the semiconductor processing apparatus will now be explained.

As illustrated by the air flows in the directions indicated by the arrows in FIG. 2, air introduced from the air inlet port 2 of the main body 1 flows in the first filter unit 3 provided in the main body 1. In the first filter unit 3, the amount of discharged air from the air outlet port 5 is larger than the amount of taken-in air from the air intake port 4. Part of clean air blown out from the air outlet port 5 is returned to the air return port 6 of the filter unit 3 and then discharged from the air outlet port 5 again. Clean air flows out from the air outlet port 5 in a stable, laminated state and is supplied to the wafers in the carriers 9 arranged close to the air outlet port 5.

Air which has passed on the wafers is taken in from the air intake port 12 of the second filter unit 11 provided above the I/O port 10 of the main body 1 and then discharged from the air outlet port 13. The clean air discharged from the air outlet port 13 is supplied to the wafers arranged in a longitudinal direction in the carriers 9.

The air which has passed on the I/O port 10 flows in the lower duct 22 formed in the lower portion of the main body 1 and then in the air intake ports 24 of the third filter units 23a and 23b. Clean air blows out from the air outlet ports 25 of the third filter units 23a and 23b to be laterally supplied in a laminated state to the wafer boat 21 disposed close to the air outlet ports 25. In other words, clean air is supplied to the wafers 8 arranged laterally on the wafer boat 21.

The air which has passed on the wafer boat 21 flows in the air intake port 26 of the side duct 35 and discharged from the air discharging port 27 into the maintenance room.

Accordingly, the formation of air flow in the main body of the apparatus reduces the amount of taken-in air and maintenance the degree of cleanliness of air in the clean room.

The filter unit of the embodiment will now be explained.

Figure 7:
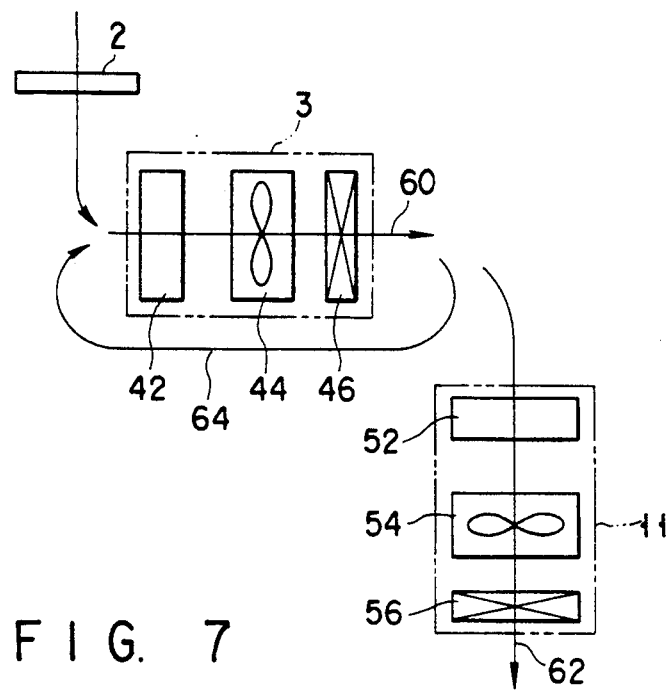
FIG. 7 is a schematic view explaining air flows at the first and second filter units.

As shown schematically in FIG. 7, the first and second filter units 3 and 11 comprises dampers 42 and 52 for adjusting the amounts of taken-in air, respectively, blowers 44 and 45 provided with centrifugal multiblade type fans (sirocco fans) for blowing air, and air filters 46 and 56 for removing dust from air and sending it out as clan air. The amount of taken-in air by the dampers 42 and 52 and the amount of air sent out by the blowers 44 and 54 are selected to set the speed of clean air preferably to 0.3 m/sec at a position separated by a predetermined distance (10 cm, for example) from the air blowing-out surface of the filters 46 and 56.

Since the first and second filter units 3 and 11 are provided at an upstream portion and a downstream portion of the clean air passages, respectively, clean air which has blown out from the first filter unit 3 in a form of a side flow 60 is taken in the second filter unit 11 and flows a down flow 62 through the second filter unit 11. In this case, part of the clean air blown out from the first filter unit 3 does not enter the second filter unit 11 but is returned to the upstream side of the first filter unit 3 along a return passage 64.

In the embodiment, the area ratio of the filter 46 to the filter 56 is set to S1:S2=4:1, and the air discharging ratio of the filter 46 to the filter 56 is set to Q1:Q2=4:1. In this connection, $\frac{3}{4}$ of the total amount of air discharge from the filter 46 is returned, and thus the amount of clean air taken in from the outer atmosphere of the apparatus through the air inlet port 2 is $\frac{1}{4}$ of the total amount of air discharge, resulting in the reduction of the amount of taken-in air.

In this arrangement, the dampers 42 and 52 and the blowers 44 and 54 can be adjusted when the apparatus is set such that a side flow and a down flow are smoothly formed at a predetermined speed without generating turbulence.

The provision of the return passage 64 in this embodiment enables clean air to be sent out from each filter unit at a required speed even if the air discharging areas S1 and S2 of the filter units 3 and 11 differ from each other.

Clean air flows on the carriers 9 in the following order. First, a down flow 62 is formed on the carriers 9 when the carriers 9 are transported through the auto doors 28 onto the I/O port 10. Then, a side flow 60 is formed when the carriers 9 are loaded on the carrier stage 7. Thereafter, the air passages through the air filter 56 and the fir flow is changed from the side flow 60 to a down flow 62 to cause the filtered air to flow on the carriers 9 again. Since the first down flow makes the carriers 9 in the carrier stage 7 relatively clean, the filter 56 is less contaminated when the air flow changed from the side flow 60 to the second down flow 62 is used.

The control system of the filter units will now be explained.

The vertical heat treating apparatus of this embodiment has the third filter units 23a and 23b as well as the first and second filter units 3 and 11. The third filter units 23a and 23b are provided at such positions that, as shown in FIG. 2, a side flow is formed on wafers 8 horizontally held in the wafer boat 21 both before the wafer boat 21 is loaded and after the wafer boat 21 has been unload. Two doors 50a and 50b through which operators enter the main body 1 in order to maintain it are provided on the lower portion of the main body 1. The third filter units 23a and 23b are mounted in the doors 50a and 50b.

Figure 8:
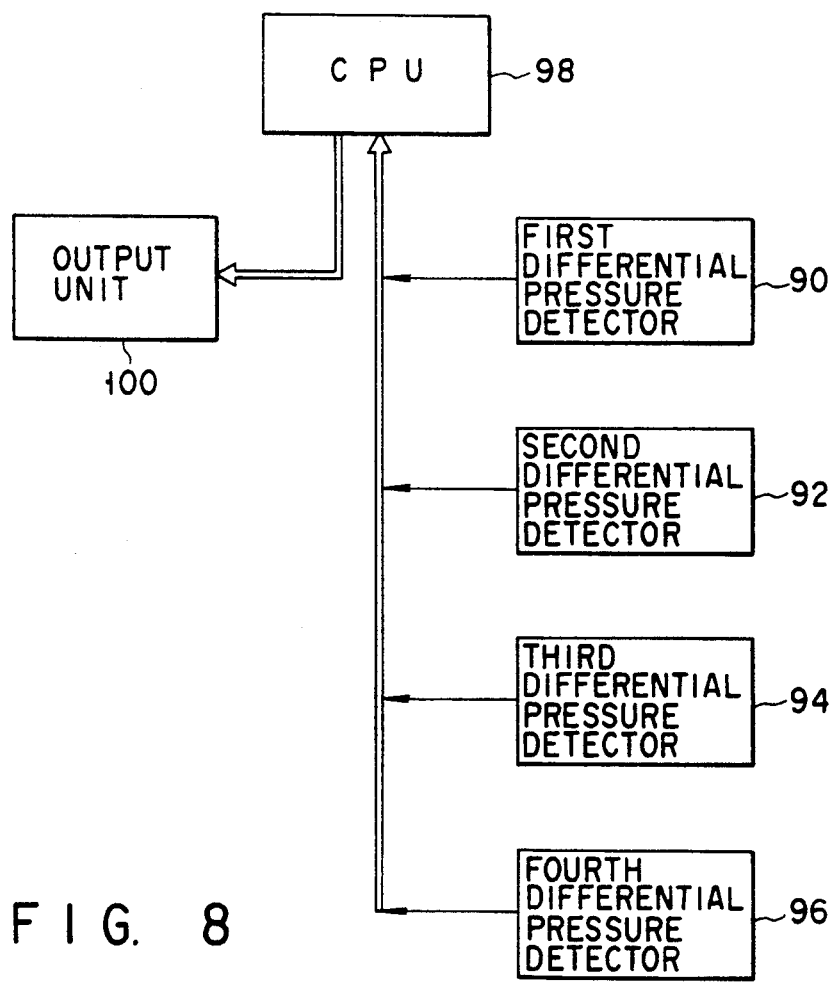
FIG. 8 is a block diagram of a pressure detector provided in the filter units.
Figure 9:
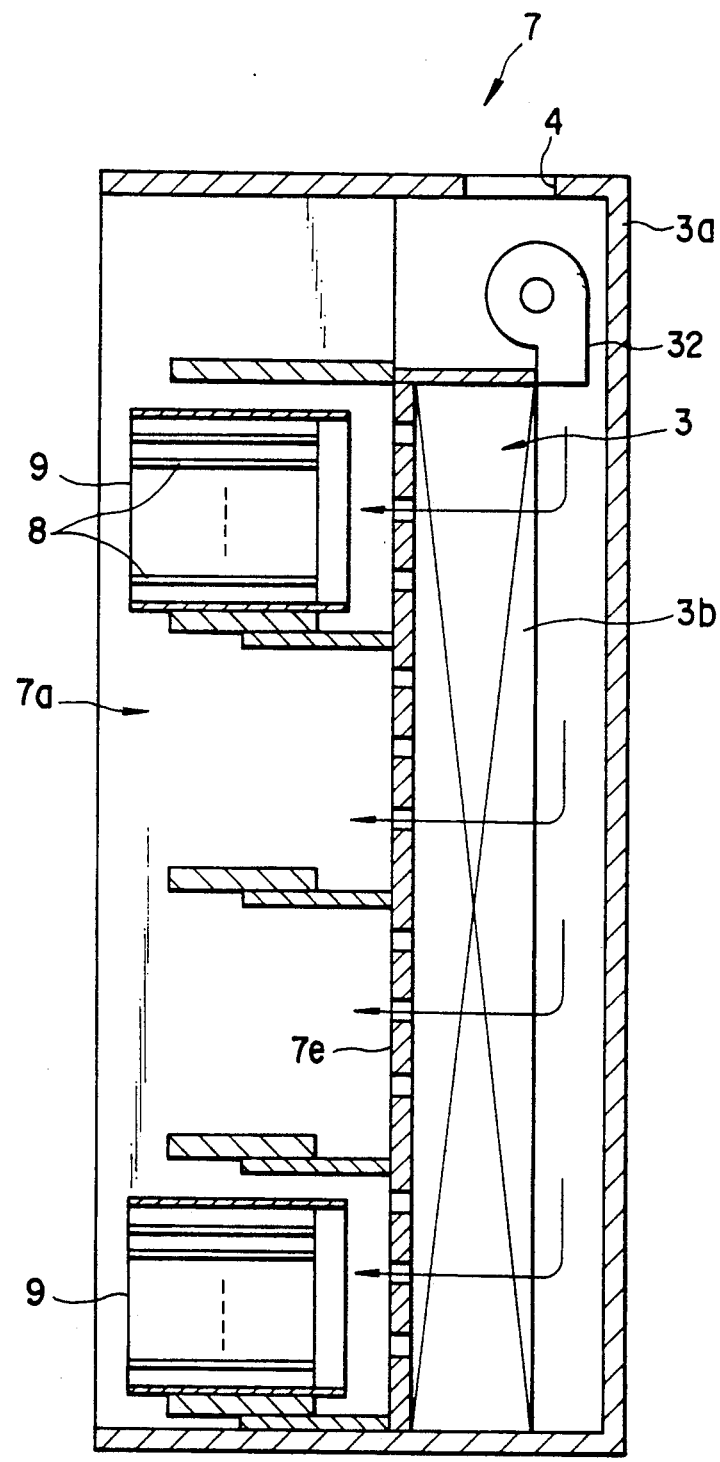
FIG. 9 is a view for enlargely showing a carrier stage.
Figure 10:
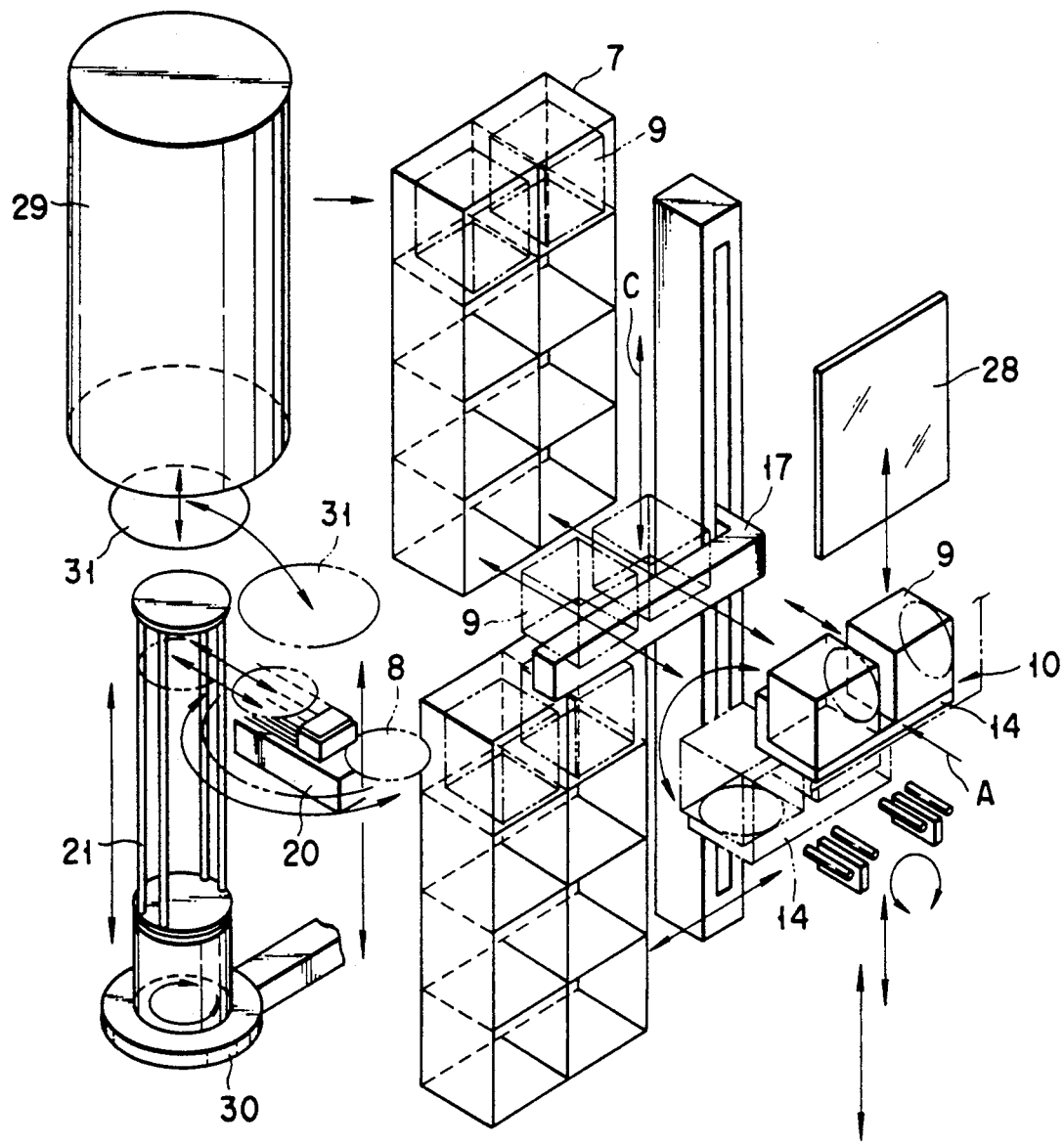
FIG. 10 is a view for showing an apparatus according to another embodiment of the present invention.

In this embodiment is provided a monitoring system for monitoring the operation of the first, second and third filter units 3, 11, 23a and 23b. As shown in FIG. 8, these filter units 3, 11, 23a and 23b contain first, second, third and fourth differential pressure switches (pressure detectors or pressure devices) 90, 92, 94 and 96 for detecting pressures (such as the differences between the pressures at the filter units and the atmospheric pressure) of air fans of the corresponding filter units 3, 11, 23a and 23b. A CPU 98 receives input signals from the switches 90 to 96 and outputs information from the filter units 3, 11, 23a and 23b to an output unit 100 such that the information is displayed or represented in a form of sounds.

When the first, second and third air filter units 3, 11, 23a and 23b are not so contaminated in case the air fans are rotated at a set speed, the pressures of the air fans are always higher than the predetermined pressure. When the air fans are troubles, the pressures of the air fans decrease. With the monitoring system as described above, when the pressure of any air filter unit becomes lower than the predetermined pressure, the differential pressure switch 90, 92, 94 or 96 of said any air filter unit sends a signal to the CPU 98 an outputs the same, whereby it is detected that the filter unit is in an abnormal state. Accordingly, the monitoring system facilitates the central control of the air filter units.

In order to obtain such information that the air filters are contaminated from the filter units, more than two differential switches operating at different pressure differences (5 mm $H_2O$, 0.4 mm $H_2O$, etc.) may be prepared for each filter unit.

This invention is not only applied to a vertical heat treating apparatus for a semiconductor manufacturing device but to various apparatuses in which clean air flows are formed in at least two portions. This invention is also applicable to apparatuses installed in a clean room and provided with a plurality of filter units, such as a CVD apparatus and an etching apparatus. It is preferred that each filter unit has least a filter and air blowing means selected from various types.

In the embodiment, the air discharging areas of the filters prepared in the different steps are different from each other, but may be made equal to each other. In this case, the amount of air taken in from the exterior of the main body of the apparatus can also be reduced.

The system for preventing contaminant, such as dusts, etc. from entering the apparatus from the outside of the apparatus when auto door 28 provided in the I/O port 10 is opened/closed, will now be described.

A vertical heat treating apparatus of the present embodiment comprises suction fan 32 and exhaust fan 34, as stated above. The amount of wind of the exhaust fan is adjusted by means of fan controller 34a connected to exhaust fan 34, with the result that the suction efficiency of suction fan 32 is higher than the exhaust efficiency of exhaust fan 34, and the inside pressure of body 1 of the apparatus can be set higher than the outside pressure thereof.

In the present embodiment, while carrier 9 is carried in the apparatus, the flow rate of air supplied to I/O port 10 from the second filter unit 11, in a laminar flow manner, is set so that the inside pressure of the apparatus is higher than the inside pressure of clean room 40 at which the front face of the apparatus is situated. Consequently, the amount of dusts entering the apparatus from the side of clean room 40 when auto door 28 is opened, is reduced.

The air pressure in the clean room is generally set at about 0.5 mm $H_2O$ witch is higher than the air pressure in the maintenance room, in order to prevent dusts from entering from the maintenance room. In the present apparatus, the inside air pressure of the apparatus is set at 0.65 mm $H_2O$ higher than the inside air pressure of the maintenance room, and that of the apparatus is set at 0.15 mm $H_2O$ higher than that of the clean room. However, if the differential pressure between the clean room and the apparatus is set at more than 0 and less than 2 mm $H_2O$, it is possible to obtain such an advantage as preventing the entering of the dusts from the clean room.

Moreover, the amount of the exhausted clean air is made to be the same as that of the sucked clean air, the laminar flow of the clean air is formed in the apparatus, and heat treatment process is carried out. The fan may be controlled so that the inside pressure of the apparatus is made higher, by increasing the amount of clean air to be sucked, than the amount of clean air to be exhausted, only when auto door 28 of I/O port 10 is opened.

Figure 11:
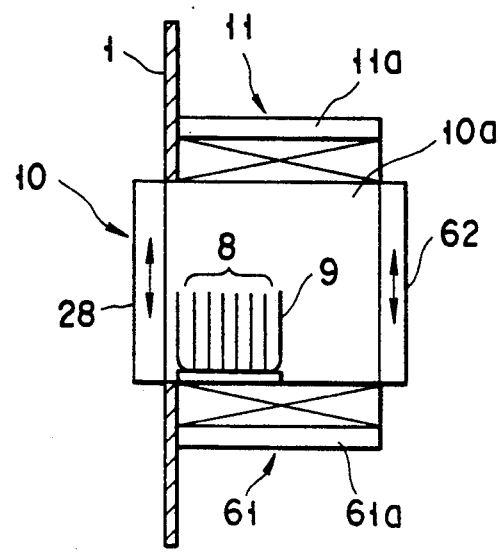
FIG. 11 is a view for illustrating a modification of the mechanism for preventing the entering of dusts.

The modification of the system for preventing the dusts from entering from I/O port will now be described with reference to FIG. 11.

In this modification, a pass box 10a is provided on the I/O port 10. The upper face wall of the pass box 10a comprises an upper filter unit 11 integrated with a fan 11a, and the lower face wall thereof comprises a lower filter unit 61 integrated with fan 61a. The clean air supplied into pass box 10a from the upper filter unit 11 is flown below through the lower filter unit 61. Moreover, a vertically openable second auto door 62 is provided on the rear side surface of the pass box 10a, which separates the inside space of the pass box 10a from that of body 1.

In this modification, unless the first auto door 28 of the pass box 10a and the second auto door 62 are be kept clean, because the dusts do not directly enter into the inside of body 1 from the side of clean room 40.

Moreover, owing to the lower filter unit 61, the capacity of the fan 61a in the lower filter unit 61 is adjustable smaller than that of the fan 11a in the upper filter unit 11, so that the inside pressure of pass box 10a can be kept higher than that of clean room 40.

Another modification of the above system will now be described with reference to FIGS. 12 and 13.

Figure 12:
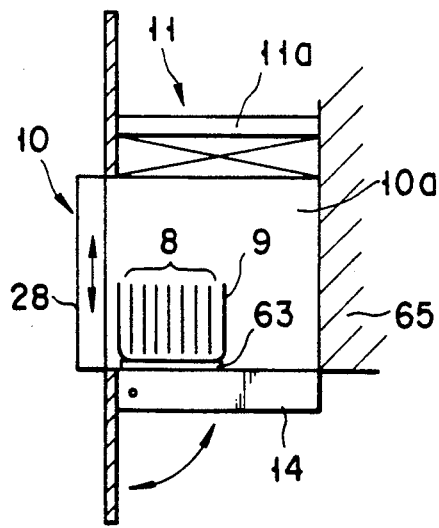
FIGS. 12 and 13 are views for illustrating a modification of the mechanism for preventing the entering of dusts.

In this modification, as shown in FIG. 12, a carrier-holding-system 63 holding the carrier or carriers 9 in which semiconductor wafers are vertically arranged is provided on a position changing mechanism 14. Position changing mechanism 14 rotates downward 90° so as to rotate the position of carrier 9 downward 90° so that the opened rear face of the carrier turns to the rear side. Three surfaces forming I/O port 10, except the sides defined by position changing mechanism 14, auto door 28, and filter unit 11 are covered with wall 65, and form a closed pass box 10a.

Figure 13:
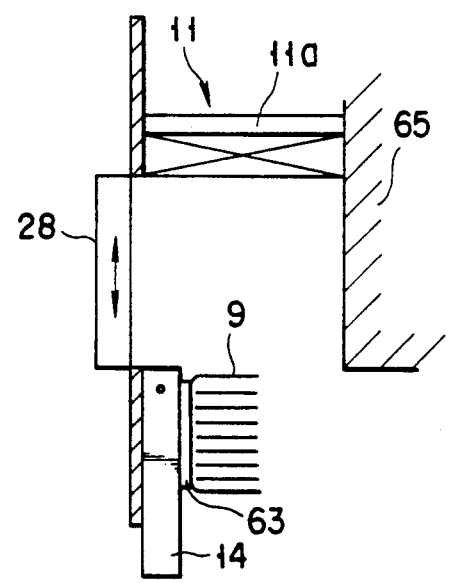

In this embodiment, as shown in FIG. 13, by rotating the position changing mechanism 14 downward 90°, carrier transfer 17 in FIG. 1 can receive carrier 9, and transfer carrier 9 to carrier stage 7 or transfer stage 18.

Moreover, as shown in FIG. 12, pass box 10a is closed by returning position changing mechanism 14 in the previous position, the inside space is opened by opening auto door 28, and auto door 28 is closed after transferring carrier 9 housing semiconductor wafers 8, so that carrier 9 can be transferred in the apparatus, without communicating clean room 40 with the inside space of body 1. Therefore, in this modification, it is possible to prevent the dusts from entering the inside of the apparatus from the clean room side.

The clean air apparatus of the present invention is not only applicable to the semiconductor wafers as a processed article but is applicable to heat treatment for a square glass substrate, etc.

In addition, the clean air apparatus of the present invention is installed in clean rooms of CVD apparatus, a semiconductor manufacturing apparatus, such as a carrier stocker, LCD manufacturing apparatus, etc. The clean air apparatus is applicable to various apparatuses in which the entering of dusts must be prevented.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A clean air apparatus comprising:
   a housing having an opening through which a carrier housing a plurality of objects to be treated is supplied into the housing from the outside of the housing, and an I/O port for supporting the carrier which is supplied into the housing;
   means for treating the object, provided in the upper portion of the housing;
   first means for supporting a plurality of carriers at the same time, provided in the upper portion of the housing and the side portion of the treating means;
   second means for supporting at least one carrier, provided in the lower portion of the housing;
   means provided in the housing to be selectively movable between the I/O port and the first supporting means, between the I/O port and the second supporting means, and between the first supporting means and the second supporting means, for transporting the carrier among the I/O port, the first supporting means and the second supporting means;
   means for performing the selective movement of the transporting means;
   means for applying a clean air to the objects in the carriers supported by the I/O port, the first supporting means and the second supporting means.

2. The clean air apparatus according to claim 1, which comprises means for supplying object in the carrier supported by the second supporting means to the treating means.

3. The clean air apparatus according to claim 1, wherein said I/O port includes means for turning the carrier supported by the I/O port by 90 degrees.

4. The clean air apparatus according to claim 3, wherein said I/O port supports the carrier thereon and is attached to the housing to be turned by 90 degrees, and said turning means includes means for turning the I/O port by 90 degrees.

5. The clean air apparatus according to claim 1, wherein said second supporting means includes means for supporting a plurality of carriers at the same time.

6. A clean air apparatus comprising;
   a housing having an opening through which a carrier holding a plurality of objects to be treated is applied into the housing from the outside of the housing, and an I/O port for supporting the carrier which is applied into the housing;
   means for preventing dusts from entering the housing from the outside through the opening;
   means for treating the object, provided in the upper portion of the housing;
   first means for supporting a plurality of carriers at the same time, provided in the upper portion of the housing and the side portion of the treating means;
   second means for supporting at least one carrier, provided in the lower portion of the housing;
   means provided in the housing to be selectively movable between the I/O port and the first supporting means, between the I/O port and the second supporting means, and between the first supporting means and the second supporting means, for transporting the carrier among the I/O port, first supporting means and the second supporting means;
   means for performing the selective movement of the transporting means;
   means for applying a clean air to the objects in the carrier or carriers supported by at least one of the I/O port, the first supporting means and the second supporting means.

7. The clean air apparatus according to claim 6, wherein said preventing means includes a door for opening/closing the opening of the housing.

8. The clean air apparatus according to claim 7, wherein said preventing means includes means for maintaining the pressure of the inside of the door to be equal to or higher than that of the outside thereof, when the door is at least opened.

9. A clean air apparatus comprising:
   a housing having a supplying opening through which a carrier is supplied into the housing from the outside of the housing, the carrier including one side wall and an opposite side wall respectively having openings therethrough and holding a plurality of objects to be treated so that objects are arranged in a parallel relationship with one another and at a predetermined space between the adjacent ones, the space communicating with the openings in the one side and opposite side walls;
   an I/O port provided in the housing near the supplying opening for supporting the carrier which is supplied into the housing with side walls disposed horizontally;
   means for turning the carrier supported by the I/O port by 90 degrees so that the side walls are vertical;
   means for treating the object, provided in the upper portion of the housing;
   first means for supporting a plurality of carriers of which the side walls are vertical at the same time, provided in the upper portion of the housing and the side portion of the treating means;
   second means for supporting at least one carrier of which the side walls are vertical, provided in the lower portion of the housing;
   means for transporting the carrier between the I/O port and the first supporting means, and between the first supporting means and the second supporting means, maintaining the carrier with the side walls directed vertical; and means for applying an clean air to the objects in the at least one carrier supported by at least one of the I/O port, the first supporting means and the second supporting means.

10. The clean air apparatus according to claim 9, wherein said clean-air applying means including means for flowing the clean air to the objects in the carrier, to the opposite side wall of the carrier from the one side wall through the space between the adjacent objects.

11. The clean air apparatus according to claim 10, wherein said treating means includes a heating tube having an opening thereunder, and a lid for opening/closing the opening of the heating tube.

* * * * *

UNITED STATES PATENT AND TRADEMARK OFFICE
CERTIFICATE OF CORRECTION

PATENT NO. : 5,261,935
DATED : NOVEMBER 16, 1993
INVENTOR(S) : KATSUMI ISHII, ET AL.

It is certified that error appears in the above-indentified patent and that said Letters Patent is hereby corrected as shown below:

On title page,

In the Related U.S. Application Data, section [63], delete in its entirety and insert --Continuation-in-part of U.S. Patent Application Serial No. 07/765,890, filed September 26, 1991, U.S. Patent 5,236,181, and U.S. Patent Application Serial No. 07/911,479, filed July 10, 1992, U.S. Patent 5,219,464, which is a continuation-in-part of U.S. Patent Application Serial No. 07/772,836, filed October 8, 1991, U.S. Patent 5,181,819, which is a continuation-in-part of U.S. Patent Application Serial No. 07/765,890, filed September 26, 1991, U.S. Patent 5,236,181.--

In column 1, lines 6-12, delete in their entirety and insert --This invention is a continuation-in-part of U.S. Patent Application Serial No. 07/765,890, filed September 26, 1991, now U.S. Patent 5,236,181, and U.S. Patent Application Serial No. 07/911,479, filed July 10, 1992, now

UNITED STATES PATENT AND TRADEMARK OFFICE
CERTIFICATE OF CORRECTION

PATENT NO. : 5,261,935
DATED : NOVEMBER 16, 1993
INVENTOR(S) : KATSUMI ISHII, ET AL.

It is certified that error appears in the above-indentified patent and that said Letters Patent is hereby corrected as shown below:

U.S. Patent 5,219,464, which is a continuation-in-part of U.S. Patent Application Serial No. 07/772,836, filed October 8, 1991, now U.S. Patent 5,181,819 which is a continuation-in-part of U.S. Patent Application Serial No. 07/765,890, filed September 26, 1991, now U.S. Patent 5,236,181.--

Signed and Sealed this

Sixteenth Day of August, 1994

Attest:

BRUCE LEHMAN

*Attesting Officer*      *Commissioner of Patents and Trademarks*